US006781668B2

(12) United States Patent
Schuster et al.

(10) Patent No.: US 6,781,668 B2
(45) Date of Patent: Aug. 24, 2004

(54) OPTICAL ARRANGEMENT

(75) Inventors: Karl-Heinz Schuster, Königsbronn (DE); Hubert Holderer, Königsbronn (DE); Rudolf Von Bünau, Esslingen (DE); Christian Wagner, Aalen (DE); Jochen Becker, Overkochen (DE); Stefan Xalter, Oberkochen (DE); Wolfgang Hummel, Schwabisch Gmund (DE)

(73) Assignee: Carl-Zeiss-Stiftung (DE)

( * ) Notice: Subject to any disclaimer, the term of this patent is extended or adjusted under 35 U.S.C. 154(b) by 0 days.

(21) Appl. No.: 09/752,282

(22) Filed: Dec. 29, 2000

(65) Prior Publication Data

US 2001/0006412 A1 Jul. 5, 2001

(30) Foreign Application Priority Data

Dec. 29, 1999 (DE) ......................................... 199 63 587

(51) Int. Cl.[7] ........................... G03B 27/52; G03B 27/42
(52) U.S. Cl. ........................................... 355/30; 355/53
(58) Field of Search ............................. 355/30, 53, 67; 359/350, 512

(56) References Cited

U.S. PATENT DOCUMENTS

| 5,025,284 A | * | 6/1991 | Komoriya et al. ............ 355/53 |
| 5,602,683 A | | 2/1997 | Straaijer ...................... 359/811 |
| 5,696,623 A | * | 12/1997 | Fujie et al. .................. 359/350 |
| 5,805,273 A | | 9/1998 | Unno ............................ 355/30 |
| 5,883,704 A | | 3/1999 | Nishi et al. .................... 355/67 |
| 5,920,377 A | * | 7/1999 | Kim .............................. 355/30 |
| 5,995,263 A | * | 11/1999 | Tokuda et al. ............... 359/196 |
| 6,099,763 A | * | 8/2000 | Su et al. ....................... 264/2.2 |

FOREIGN PATENT DOCUMENTS

| JP | 408045827 A | * | 2/1996 |
| JP | 08-181058 | | 12/1996 |
| JP | 10-214782 | * | 11/1998 |

* cited by examiner

Primary Examiner—Henry Hung Nguyen
(74) Attorney, Agent, or Firm—Factor & Lake

(57) ABSTRACT

An optical arrangement, in particular a microlithographic projection printing installation, has in particular a slot-shaped image field or rotationally non-symmetrical illumination. An optical element (5) is therefore acted upon in a rotationally non-symmetrical manner by the radiation of a light source. To temper the optical element (5), a supply apparatus (11, 19 to 23) for gas is used. The latter having at least one supply line (21) and at least one gas directing device (11). The latter is aligned relative to the optical element (5) and controllable in such a way that the gas is directed by the gas directing device (11) towards the optical element (5). The volumetric flow of the exiting gas therefore has a magnitude and spatial distribution (17), which are adapted to the intensity distribution (6) of the radiation. By virtue of such tempering, rotationally non-symmetrical light-induced image defects in the optical element (5) are avoided or compensated.

14 Claims, 2 Drawing Sheets

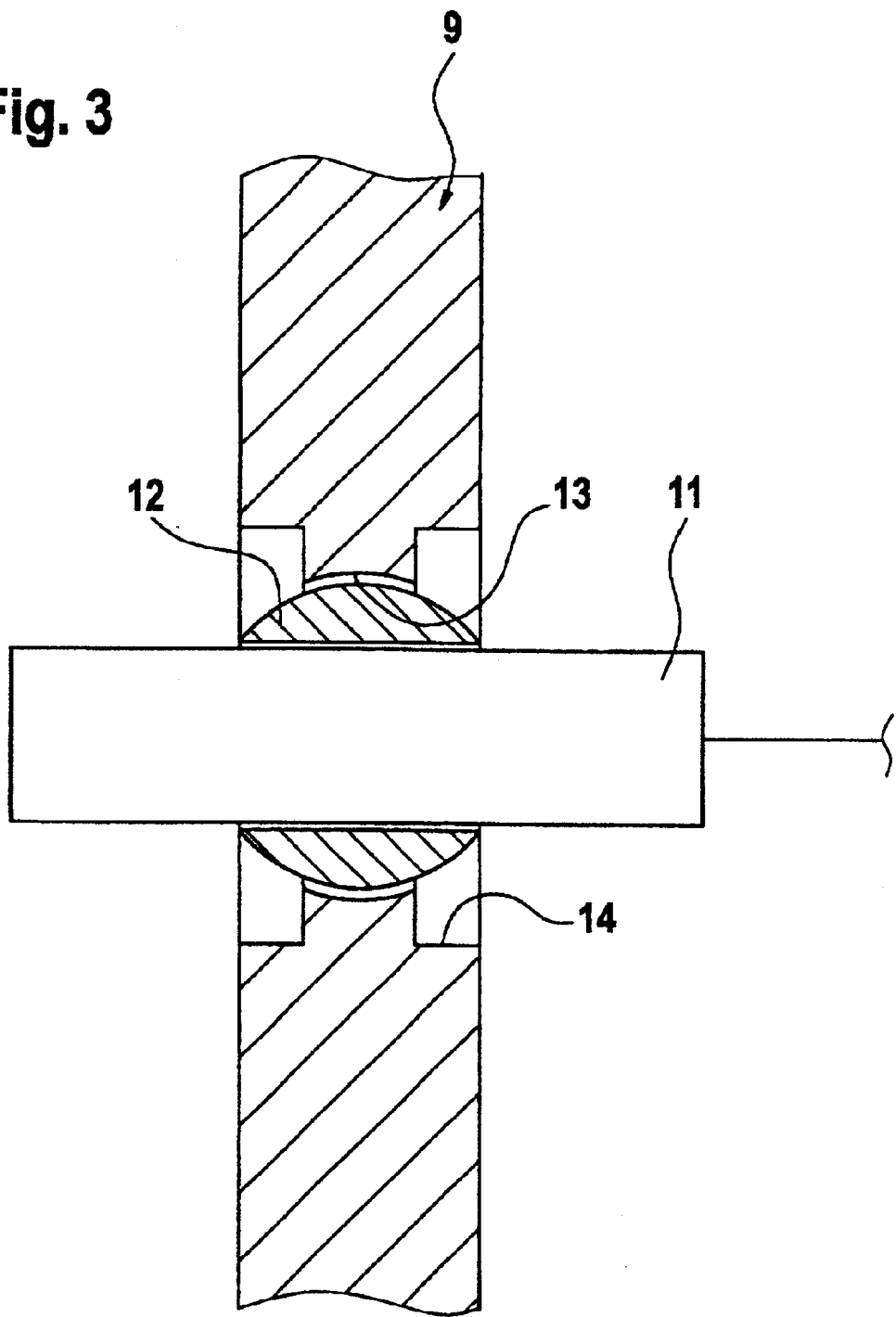

OPTICAL ARRANGEMENT

BACKGROUND OF THE INVENTION

The invention relates to an optical arrangement, in particular to a microlithographic projection printing installation, in particular having a slot-shaped image field or rotationally non-symmetrical illumination, comprising a light source which emits radiation, and an optical element which is heated by being acted upon by the radiation, and a supply apparatus for gas for tempering the optical element.

The imaging quality of such an optical arrangement is often impaired by rotationally non-symmetrical image defects. Such image defects arise, for example, not only as a result of rotationally non-symmetrical light-induced heating of the optical element but also as a result of other light-induced effects, such as e.g. compaction, which lead to a corresponding, rotationally non-symmetrical expansion and/or refractive index distribution in the optical element. When high imaging quality is required, as it is in particular for microlithographic projection printing processes, the described light-induced image defects cannot be tolerated and therefore have to be avoided or corrected.

From U.S. Pat. No. 5,920,377 A an optical arrangement of the type described initially is known, in which the temperature distribution in an optical system is influenced by a gas supply. For said purpose, the volumetric flow is given a spatial distribution which is adapted to the intensity distribution of the radiation. To said end, the housing for the optical system is subdivided into a plurality of gas flow zones, each with a separate gas supply. Selection of the spatial distribution of the volumetric flow is effected in U.S. Pat. No. 5,920,377 A by means of the configuration of the gas flow zones. As the thus influenceable thermal coupling of the optical elements of the optical system to the various gas flows is effected via their peripheral surface, precise adjustment of a specific temperature distribution for compensating image defects is possible only to a very limited extent. In addition, control of the flow conditions in the gas flow zones is problematical. It is impossible to rule out the formation in the gas flow zones of dead volumes, in which the gas is substantially stationary and so in an undesirable manner no heat transport occurs.

The object of the present invention is therefore to develop an optical arrangement of the type described initially in such a way that an improved adjustment of a specific temperature distribution in the optical element may be achieved.

BRIEF SUMMARY OF THE INVENTION

Said object is achieved according to the invention in that the supply apparatus comprises at least one supply line and at least one gas directing device, which is aligned relative to the optical element and controllable in such a way that the gas is directed by the gas guiding device as a free flow towards the optical element and the volumetric flow of the exiting gas has a magnitude and spatial distribution, which are adapted to the intensity distribution of the radiation.

By means of such a gas directing device the tempering of the gas-exposed region of the optical element may be adapted well to the shape of the light-induced image defect and the temperature distribution in the optical element may be purposefully selected. The gas directing device in the present case causes the gas to flow directly against the optical element so that, by virtue of the thermal coupling of the latter to the gas flow, effective tempering is provided. Dead volumes, from which gas is not removed, are avoided particularly in the regions of the optical element which are to be tempered.

In the present case, thermal coupling to the gas flowing past leads e.g. to extensive compensation of the asymmetrical heating caused by the light absorption, resulting in a rotationally symmetrical temperature distribution. Image defects based on thermal expansion of the material of the optical element are thereby avoided. However, by virtue of a purposeful flow against the optical element it is also possible to compensate additional image defects caused, for example, by compaction and the resulting change of refractive index. For said purpose, by means of the flow of gas against the optical element an asymmetrical temperature distribution is deliberately produced in the latter, wherein the consequent changes of the imaging properties of the optical element as a result of the asymmetrical expansion of the material of the optical element and the image defects caused e.g. by compaction compensate one another in such a way that, on the whole, selected imaging properties of the optical element arise.

A throttle valve may be disposed in at least one supply line for the gas directing device. By said means the magnitude of the volumetric flow is easily adaptable to the requirements for tempering of the optical element.

The gas directing device may be formed by at least one nozzle, which is connected by the supply line to a gas source. A nozzle enables a precise flow against a region of the optical element which is to be tempered.

Preferentially a plurality of gas directing devices are provided, with each of which a throttle valve in a supply line section is associated. This enables an adaptation to an irradiation with projection light, the intensity distribution of which varies over the irradiated area of the optical element. For example, given use of a cooling gas, the flow against regions which are subjected to increased light-induced heating may be correspondingly greater.

For the gas directing device an adjustable holding device may be provided. This enables purposeful alignment of the gas directing device relative to the optical element.

The holding device may comprise an adjusting device for adjusting the axial position of the gas directing device relative to the optical element. It is therefore possible to adjust the size of the zone of impingement of the gas flow exiting from the gas directing device in the direction of the optical element.

Alternatively or additionally the holding device may comprise an adjusting device for adjusting the inclination of the gas directing device relative to the optical element. By means of an inclination adjustment both the position and the shape of the respective impingement zone of a gas directing device are adjustable relative to the optical element.

A control device with a communication link to the at least one throttle valve is preferentially provided for selecting a volumetric flow of gas in the gas directing device. This enables automatic and precise adjustment of the volumetric flow of the gas provided for tempering.

Said control device may have a communication link to the light source for receiving a signal corresponding to the light output of the light source, wherein selection of the volumetric flow of gas is effected by the control device in dependence upon the transmitted signal of the light source. This allows the gas tempering to be adapted to the projection light output used in each case.

Alternatively or additionally a sensor arrangement with a communication link to the control device is provided for monitoring the imaging quality of the optical element and/or of the optical arrangement, wherein selection of the volumetric flow of gas is effected by the control device in dependence upon the transmitted signal data of the sensor arrangement. This enables a regulation of the gas supply, whereby the optical element is tempered by the gas supply in the regions selected by the control device on the basis of the signal data relating to the imaging quality. Such regulation allows, for example, image correction of a system of optical elements. In said case, by means of the gas tempering of an optical element the imaging properties of the latter are over-compensated in such a way that, despite the light-induced image defects of the other optical elements, on the whole an image-corrected optical arrangement is achieved.

The sensor arrangement may comprise a CCD array. By means of such a sensor arrangement a precise acquisition of the imaging properties of the optical element and/or of the optical arrangement is possible.

The gas directing device is preferentially part of a sweeping device for the optical element and/or optical arrangement. The sweeping and tempering functions are therefore combined.

In a preferred form of construction, a thermostatted tempering device is provided in the supply line. This enables an exact temperature selection of the gas flow so that the tempering possible with a gas flow of a preselected volumetric flow may be exactly determined.

An embodiment of the invention is described in detail below with reference to the drawings; the drawings show:

BRIEF DESCRIPTION OF THE SEVERAL VIEWS OF THE DRAWINGS

FIG. 3: to an enlarged scale an adjustable nozzle of the gas tempering apparatus in a neutral position.

DETAILED DESCRIPTION OF THE INVENTION

Figure 1:
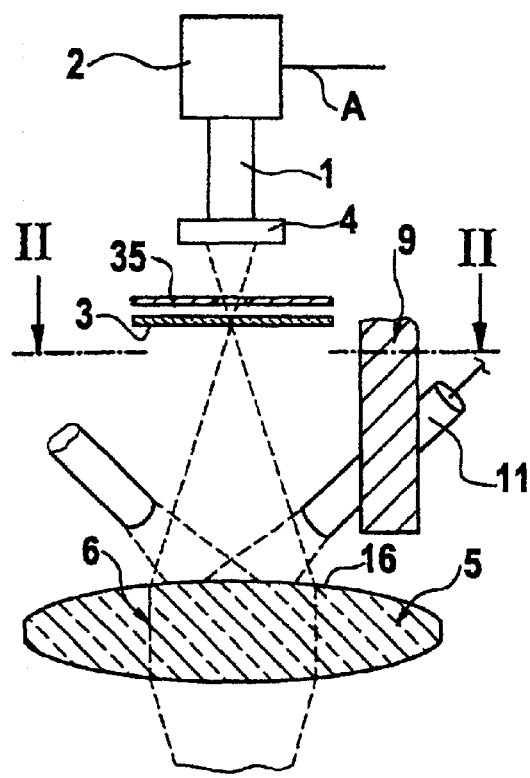
FIG. 1: a meridional section of an optical arrangement with a gas tempering apparatus for a lens.

The optical arrangement illustrated diagrammatically in FIG. 1 is part of a microlithographic projection printing installation. In said arrangement a projection light beam 1 of a light source 2 is guided for imaging a reticle 3, which carries the structural information to be projected, onto a wafer which is not shown in FIG. 1. A powerful UV laser, e.g. an argon-fluoride excimer laser, is typically used as light source 2.

Optical elements for guiding and/or shaping the projection light beam 1 are focusing optics 4 which focus the projection light beam 1 onto the reticle 3, a mask 35 which in a manner yet to be described delimits the cross section of the projection light beam in order to define a slot-shaped image field, and a lens 5 which is part of a projection lens system used to image the structural information of the reticle 3 onto the wafer. The lens 5 is made of material which is highly transparent to UV light, such as quartz glass or $CaF_2$.

Figure 2:
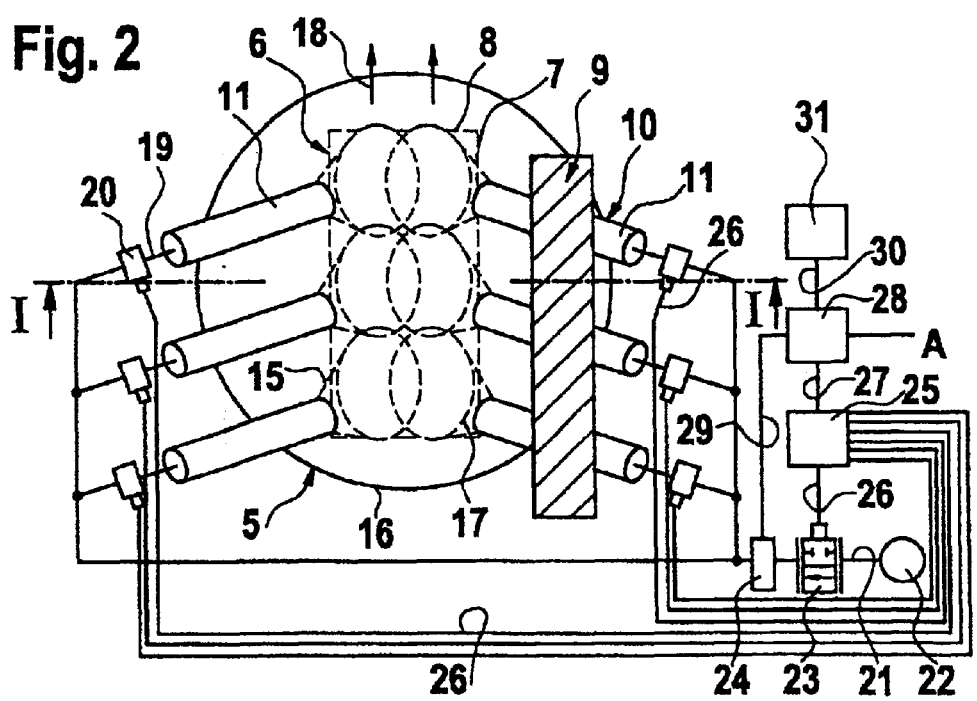
FIG. 2: a section according to line II—II of FIG. 1.

The projection light beam 1, as it penetrates the lens 5, has a rectangular cross-sectional area defined by the mask 35 and illustrated by a dashed rectangle 6 in FIG. 2. The cross-sectional area 6 has a longitudinal side 7 and a narrow side 8, the length ratio of which is approximately 3:1.

Two holding blocks 9 for one nozzle group 10 each are disposed parallel to the longitudinal sides 7 of the cross-sectional area 6 and offset, in FIG. 1, in an upward and outward direction relative to the lens 5. A nozzle group 10 comprises three gas nozzles 11. For greater clarity, of the two holding blocks 9 only the right one is shown in each case in FIGS. 1 and 2.

The gas nozzles 11 are, as gas directing devices, part of a gas supply apparatus which is described below:

In FIG. 3 it may be seen that the gas nozzle 11 is adjustable in the holding block 9, both in terms of its axial position and its inclination relative to the lens 5. A joint ball 12 is used to adjust the inclination. Said joint ball 12 is fitted snugly into an annular receiver 13 of the holding block 9, which surrounds the gas nozzle 11 and defines a spherical cap surface complementary to the joint ball 12.

In the region of the joint ball 12 and adjacent to the receiver 13 the holding block 9 has stepped annular recesses 14. The latter allow the gas nozzle 11 to be inclined up to an angle of around 60° relative to the neutral position, which is shown in FIG. 3 and in which the gas nozzle 11 is perpendicular to the annular plane of the receiver 13. The gas nozzle 11 is in turn snugly received by the joint ball 12 so that an adjustment of the axial position of the gas nozzle 11 simply through axial displacement in the joint ball 12 is possible.

Alternatively or additionally the holding blocks 9 may be designed so as to be adjustable as a whole so that, through translation and/or rotation of the holding blocks 9, an overall displacement of the respective nozzle group 10 is possible.

Exiting from each of the gas nozzles 11 is a gas flow 15 having an edge contour, of which the divergence is illustrated in an exaggerated manner in the drawings and which is indicated as a dashed cone in FIGS. 1 and 2. A suitable gas for use in the gas tempering apparatus is, for example, an inert gas such as helium. Alternatively, dried and filtered compressed air may be used.

The gas flow 15 is directed onto a lens surface 16 of the lens 5. Owing to the inclination of the gas nozzles 11 relative to the impinged lens surface 16, on the lens surface 16 an approximately elliptical impingement zone 17 is acted upon directly by gas from each gas nozzle 11. The impingement zones 17 are indicated as dashed ellipses in FIG. 2.

The totality of the impingement zones 17 of the six gas nozzles 11 substantially covers the cross-sectional area 6, with which the lens 5 is acted upon by the projection light beam 1. Because of the inclination of the gas nozzles 11 relative to the meridional plane (cf. FIG. 2) illustrated in FIG. 1 the gas flows 15 exiting from the gas nozzles 11, after impinging on the lens surface 16, have a preferred direction parallel to the latter with components of velocity parallel and perpendicular to the plane of symmetry of the two nozzle groups 10. In said plane of symmetry the components of velocity of the gas flows 15 parallel to the meridional plane shown in FIG. 1 cancel each other out. There remains a resultant component of velocity 18 perpendicular to the meridional plane shown in FIG. 1.

Associated with each gas nozzle 11 is a gas supply line section 19, in each of which a controllable throttle valve 20 is disposed. The supply line sections 19 of the individual gas nozzles 11 combine to form a supply line 21, which is supplied from a gas storage tank 22. A throttling 2/2-way valve, as a main valve 23, and a thermostatted tempering apparatus 24 for the gas are disposed in the supply line 21.

Activation of the throttle valves 20 and of the main valve 23 is effected by means of a valve control circuit 25, which via signal lines 26 is in communication with the throttle valves 20 and/or the main valve 23. The valve control circuit 25 is connected by a further signal line 27 to a printing control circuit 28 for the projection printing installation. A further signal line 29 connects the printing control circuit 28 to the thermostatted tempering device 24. Via the terminal A the printing control circuit 28 is connected to the light source 2 (cf. FIG. 1). A further signal line 30 connects the printing control circuit 28 to a two-dimensional CCD array 31.

The gas tempering apparatus for the lens 5 operates as follows:

The lenses in the optical arrangement of the projection printing installation, e.g. the lens 5, heat up on account of the residual absorption which the material, from which they are made, presents in the region of the wavelength of the projection light beam 1. Said heating, the temperature distribution of which in a first approximation follows the absorbed radiated power distribution in the lenses, leads both to thermal expansion of the material as well as to a change of refractive index and hence, because of the changed refractive properties, to a change of the imaging properties of the lenses. The purpose of using the gas tempering apparatus is, via the thermal coupling of the gas flowing past the lens 5, to achieve a homogenization and/or purposeful shaping of the temperature distribution in the lens 5. A resulting homogenized and/or defined thermal expansion leads to image defects which are negligible and/or easy to control.

When the projection printing installation is switched on, the printing control circuit 28 initially selects rough values for the gas temperature and the volumetric flow of gas which were found to be suitable in a preliminary test. The gas temperature is in said case set so as to be lower than the operating temperature of the optical arrangement. In the present case, a typical temperature difference between gas temperature and operating temperature is 5°.

The adjustment of the gas temperature is effected in that the printing control circuit 28 via the signal line 29 assigns a setpoint value to the thermostatted tempering device 24. The volumetric flows of gas are adjusted by means of a corresponding assignment of the opening widths for the throttling valves 20 and/or the main valve 23, wherein said setpoint values are transferred from the printing control circuit 28 via the signal line 27 to the valve control circuit 25. The latter, in line with said setpoint values, effects a suitable activation of the throttle valves 20 and/or of the main valve 23. The adjustment of the main valve 23 in said case serves as a basic selection of the volumetric flow of gas, e.g. as a selection of the maximum permissible volumetric flow of gas through the gas nozzles 11. The throttle valves 26, in dependence upon the selected setpoint values, effect a corresponding reduction of said maximum volumetric flow of gas for the gas nozzles 11, for which a lower volumetric flow of gas has been selected by the printing control circuit 28.

By virtue of the lens surface 16 being acted upon by the gas flowing out of the gas nozzles 11, via the thermal coupling there is a removal of heat from the lens 5 to the gas, which leads to cooling of the lens 5 in the impingement zone.

Said cooling compensates the heating effected by residual absorption of the projection light beam 1 in the lens 5. As a result of said compensation, heating-induced image defects of the lens 5 and/or of the entire optical arrangement are reduced. The imaging quality of the optical arrangement is measured by the CCD array 31, which in a non-illustrated manner lies in a focal plane of the projection printing installation. Depending on the measurement result of the CCD array 31 and on the imaging quality of the optical arrangement, which is determined from said result using known image processing algorithms, optimized operating parameters of the gas tempering apparatus are calculated in the printing control circuit 28. Said new operating parameters, i.e. an optimized gas temperature and optimized opening widths for the throttle valves 20 and/or the main valve 23, are then adjusted by means of the thermostatted tempering device 24 and the valve control circuit 25. Thus, in an iterative manner an operating state is reached, in which the image defects of the optical arrangement are minimized.

In addition to the previously described adjustable operating parameters of gas temperature and volumetric flow of gas, the positioning of the gas nozzles 11 relative to the lens 5 may be automatically adjustable. The arrangement for adjusting the gas nozzle 11 described in FIG. 3 then comprises additional actuators (not shown) for adjusting the inclination and axial position, wherein the actuators are activated by the printing control circuit 28.

Thus, the axial position of the gas nozzles 11 may be used to adjust the size of the impingement zone 17. The further the end of the nozzle 11 is from the lens surface 16, the greater the impingement zone 17 on account of the divergence of the gas flow 15. The inclination of the gas nozzle 11 relative to the lens surface 16 may in turn be used to adjust the ellipticity of the impingement zone 17. In addition, via the inclination of the gas nozzles 11 the positions of the respective impingement zones 17 relative to the cross-sectional area 6 of the projection emission beam 1 are adjustable. A non-uniform power distribution of the projection light beam 1 within the cross-sectional area 6 and a resultant non-uniform light-induced refractive index distribution in the lens 5 may be optimally compensated in said manner.

The gas tempering apparatus, in dependence upon the focal plane imaged onto the CCD array 31, enables both optimum compensation of image defects of the lens 5 on its own as well as compensation of image defects of the entire optical arrangement. In the last case, by means of a suitable flow of gas against the lens 5 and the resultant gas cooling a purposeful over-compensation of the image defects of the lens 5 is adjusted so that, in conjunction with the image defects of the other optical elements of the optical arrangement, on the whole an improvement of the imaging properties of the optical arrangement is achieved.

Instead of gas cooling, an analogous gas heating apparatus may be used to compensate image defects via gas heating of the lens 5. In said case, the totality of the impingement zones 17 has to act upon such an area that the two heating contributions, i.e. on the one hand, heating as a result of the residual absorption of the projection light beam 1 and, on the other hand, heating as a result of the gas flow, add up to substantially homogeneous heating. The lens surface 16 acted upon by such gas heating is in said case substantially complementary to the cross-sectional area 6 of the projection light beam 1 shown in FIG. 2.

The rough values for the gas temperature and/or volumetric flow of gas to be adjusted are influenced by the instantaneous lumination output of the laser source 2. The printing control circuit 28 via the output terminal A requests said instantaneous lumination output from the light source 2.

With the gas of the gas tempering apparatus, sweeping of the lens 5 and/or of the entire optical arrangement is also possible.

What is claimed is:

1. A microlithographic projection printing installation having a rotationally non-symmetrical illumination and comprising a light source which emits radiation, an optical element which is heated by the radiation, and a supply apparatus for tempering the optical element, wherein the supply apparatus comprises at least one supply line and at least one gas nozzle for directing a gas flow onto the optical element, and an adjustable holder for the gas nozzle, wherein the holder comprises an adjusting device for adjusting the axial position of the gas nozzle relative to the optical element.

2. A microlithographic projection printing installation having a rotationally non-symmetrical illumination and comprising a light source which emits radiation, an optical element which is heated by the radiation, and a supply apparatus for tempering the optical element, wherein the supply apparatus comprises at least one supply line and at least one gas nozzle for directing a gas flow onto the optical element, and an adjustable holder for the gas nozzle, wherein the holder comprises an adjusting device for adjusting the inclination of the gas nozzle relative to the optical element.

3. A microlithographic projection printing installation having a rotationally non-symmetrical illumination and comprising a light source which emits radiation, an optical element which is heated by the radiation, and a supply apparatus for gas tempering the optical element, wherein the supply apparatus comprises at least one gas supply line and at least one gas nozzle for directing a gas flow onto the optical element, the gas nozzle being held by a holder that comprises an adjusting device for changing the spatial position of the gas nozzle relative to the optical element.

4. A projection printing installation as claimed in claim 3, wherein a throttle valve is disposed in at least one supply line for the gas nozzle.

5. A projection printing installation as claims in claim 4, wherein there is a control device with a communication link to the at least one throttle valve for selecting a volumetric flow of gas in the gas nozzle (11).

6. A projection printing installation as claimed in claim 5, wherein the control device has a communication link to the light source for receiving a signal corresponding to the light output of the light source, wherein the selection of the volumetric flow of a gas is effected by the control device in dependence upon the transmitted signal of the light source.

7. A projection printing installation as claimed in claim 5, wherein there is a sensor arrangement with a communication link to the control device for monitoring the imaging quality of the optical element and/or of the optical arrangement, wherein the selection of the volumetric flow of gas is effected by the control device in dependence upon the transmitted signal data of the sensor arrangement.

8. A projection printing installation as claimed in claim 7, wherein the sensor arrangement comprises a CCD array.

9. A projection printing installation as claimed in claim 3, wherein the gas nozzle is formed by at least one nozzle, which is connected by the supply line to a gas source.

10. A projection printing installation as claimed in claim 3, wherein a plurality of gas nozzles are provided, with each of which a throttle valve in a supply line section is associated.

11. A projection printing installation as claimed in claim 3, wherein the gas nozzle is part of a sweeping device for the optical element.

12. A projection printing installation as claimed in claim 3, wherein there is a thermostatted tempering device in the supply line.

13. A projection printing installation as claimed in claim 3, wherein the gas nozzle is part of a sweeping device for the projection printing installation.

14. A microlithographic projection printing installation having a rotationally non-symmetrical illumination and comprising a light source which emits radiation, an optical element which is heated by the radiation, and a supply apparatus for gas tempering the optical element, wherein the supply apparatus comprises at least one gas supply line and at least one gas nozzle for directing a gas flow onto an impingement zone of the optical element, the gas nozzle being held by a holder that comprises an adjusting device for altering the location of the impingement zone on the optical element.

* * * * *